(12) United States Patent
Chuo et al.

(10) Patent No.: US 10,219,379 B1
(45) Date of Patent: Feb. 26, 2019

(54) STACKED FLEXIBLE PRINTED CIRCUIT BOARD ASSEMBLY WITH SIDE CONNECTION SECTION

(71) Applicant: ADVANCED FLEXIBLE CIRCUITS CO., LTD., Zhongli (TW)

(72) Inventors: Chih-Heng Chuo, Bade (TW); Kuo-Fu Su, Zhongli (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 15/670,232

(22) Filed: Aug. 7, 2017

(51) Int. Cl.
| H05K 5/00 | (2006.01) |
| H05K 1/14 | (2006.01) |
| H05K 1/11 | (2006.01) |
| H05K 1/02 | (2006.01) |
| H05K 1/03 | (2006.01) |
| H05K 7/00 | (2006.01) |
| H05K 1/18 | (2006.01) |

(52) U.S. Cl.
CPC ............ *H05K 1/147* (2013.01); *H05K 1/028* (2013.01); *H05K 1/0393* (2013.01); *H05K 1/111* (2013.01); *H05K 1/118* (2013.01); *H05K 1/144* (2013.01)

(58) Field of Classification Search
CPC ...... H05K 1/0271; H05K 1/118; H05K 1/028; H05K 1/0393; H05K 1/189; H05K 3/326; H05K 2201/10356; H05K 1/0283; H05K 1/11; H02G 15/08

USPC .... 174/250–268, 117 F, 72 A; 361/748–749, 361/760; 439/492–498
See application file for complete search history.

(56) References Cited

U.S. PATENT DOCUMENTS

| 2006/0263013 A1* | 11/2006 | Sone ............... G02B 6/4201 385/89 |
| 2011/0031628 A1* | 2/2011 | Takada ............ G11C 5/04 257/773 |

* cited by examiner

*Primary Examiner* — Binh B Tran
(74) *Attorney, Agent, or Firm* — Rosenberg, Klein & Lee (57) ABSTRACT

A stacked flexible printed circuit board assembly with a side connection section is provided, including a first flexible printed circuit board, a second flexible printed circuit board, and a curved connection section. The curved connection section is integrally connected to and between side edges of the first flexible printed circuit board and the second flexible printed circuit board. The first flexible printed circuit board is folded in a direction toward and thus stacked on the second flexible printed circuit board such that a plurality of first contact pads of the first flexible printed circuit board correspond respectively to a plurality of second contact pads of the second flexible printed circuit board. A height adjustment layer or an adhesive layer is provided between the first flexible printed circuit board and the second flexible printed circuit board to suit the need of thickness in plugging or soldering.

10 Claims, 7 Drawing Sheets

STACKED FLEXIBLE PRINTED CIRCUIT BOARD ASSEMBLY WITH SIDE CONNECTION SECTION

BACKGROUND OF THE INVENTION

1. Field of the Invention

The present invention relates to a flexible circuit board assembly, and in particular to a stacked flexible printed circuit board assembly with a side connection section.

2. The Related Arts

Being flexible, thin, and lightweight, flexible circuits have been widely used in various fields of electronic products. To make a plugging or connection structure that requires corresponding electrical contacts on top and bottom sides, it is often to provide a rigid circuit board as a substrate and to form a plurality of contact pads on top and bottom surfaces of the circuit substrate. However, due to inflexibility of the material, such a double-sided circuit board is not applicable to contemporary electronic products that are generally compact and lightweight. Further, due to the thickness, the base plate of the circuit board is generally not matching any plug structure.

Due to the flexibility of flexible circuits, using a regular flexible circuit (such as a thin-film printed electronic flat cable, a flexible flat cable, and a flexible printed circuit board) as a connection or plugging structure often suffers insufficiency of insertion and connection strength, so as not to suit current market needs.

SUMMARY OF THE INVENTION

In view of the above problem, an objective of the present invention is to provide a connection structure for a stacked flexible printed circuit board assembly.

The technical solution adopted in the present invention to achieve the above objective is that side edges of first and second flexible printed circuit boards are connected to each other with a curved connection section and the first flexible printed circuit board is folded, with the curved connection section as a support point, in a direction toward and thus stacked on the second flexible printed circuit board such that a plurality of first contact pads of the first flexible printed circuit board correspond respectively to a plurality of second contact pads of the second flexible printed circuit board to form a flexible circuit connection structure including top and bottom contact pads. A height adjustment layer or an adhesive layer is combined between the first flexible printed circuit board and the second flexible printed circuit board.

In efficacy, the present invention combines two flexible printed circuit boards to stack on each other in a corresponding, preferably aligned manner, with a curved connection section connected therebetween to form a stacked flexible circuit connection structure including top and bottom corresponding contact pads, and a height adjustment layer is provided between the two flexible printed circuit board to suit the need of thickness in plugging or soldering. The present invention is particularly fit to connection made with a plugging member that needs top and bottom corresponding contact pads (such as a C-Type USB plugging member).

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
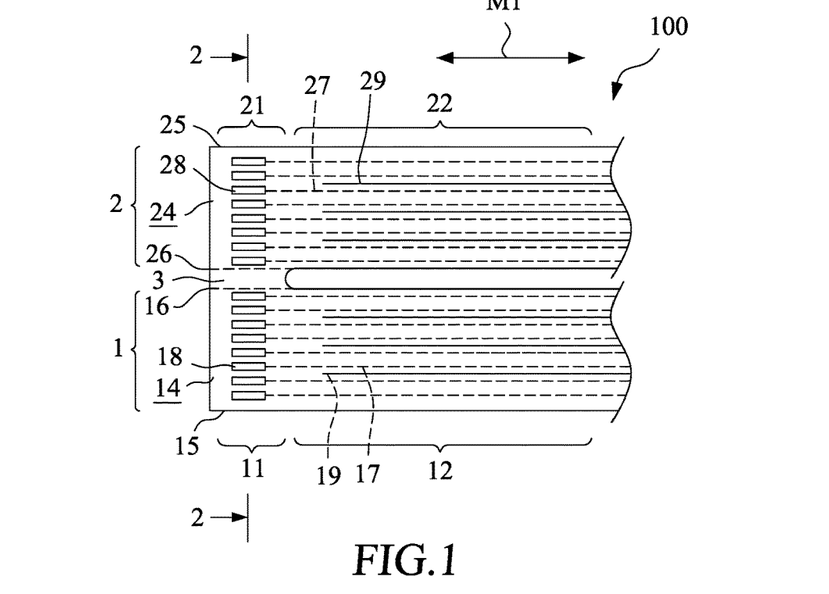
FIG. 1 is a schematic view illustrating a flexible printed circuit board according to a first embodiment of the present invention in a developed form.
Figure 2:
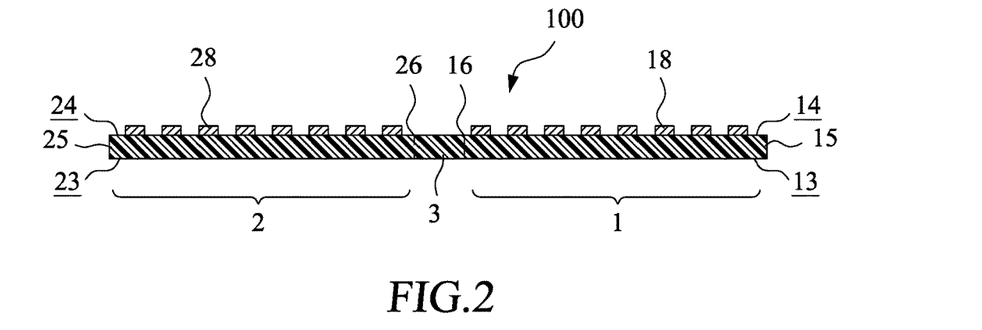
FIG. 2 is a cross-sectional view taken along line 2-2 of FIG. 1.

Referring to FIG. 1, a schematic view is provided to illustrate a flexible printed circuit board according to a first embodiment of the present invention in a developed form; and FIG. 2 is a cross-sectional view taken along line 2-2 of FIG. 1. A flexible printed circuit board 100 according to the present invention comprises a first flexible printed circuit board 1, a second flexible printed circuit board 2, and a curved connection section 3 connected between side edges of the first flexible printed circuit board 1 and the second flexible printed circuit board 2. The first flexible printed circuit board 1 and the second flexible printed circuit board 2 are each one of a thin-film printed electronic flat cable, a flexible flat cable (FFC), and a flexible printed circuit board (FPC).

The first flexible printed circuit board 1 comprises a first plugging section 11 and a first extension section 12 extending from the first plugging section 11 in a extension direction M1. The first plugging section 11 comprises a first bonding surface 13 and a first exposed surface 14. The first flexible printed circuit board 1 delimited with a first outer side edge 15 and a first inner side edge 16.

A plurality of first circuit traces 17 are arranged in the extension direction M1 on the first extension section 12 of the first flexible printed circuit board 1.

A plurality of first contact pads 18 are arranged, in a manner of being spaced from each other, on the first plugging section 11 of the first flexible printed circuit board 1 and are located on the first exposed surface 14 and connected to the plurality of first circuit traces 17.

The second flexible printed circuit board 2 comprises a second plugging section 21 and a second extension section 22 extending from the second plugging section 21 in the extension direction M1. The second plugging section 21 comprises a second bonding surface 23 and a second exposed surface 24. The second plugging section 21 is a plugging terminal section that is located adjacent to the second flexible printed circuit board 2. The second flexible printed circuit board 2 is delimited with a second outer side edge 25 and a second inner side edge 26.

A plurality of second circuit traces 27 are arranged in the extension direction M1 on the second extension section 22 of the second flexible printed circuit board 2.

A plurality of second contact pads 28 are arranged, in a manner of being spaced from each other, on the second plugging section 21 of the second flexible printed circuit board 2 and are located on the second exposed surface 24 and connected to the plurality of second circuit traces 27.

Figure 3:
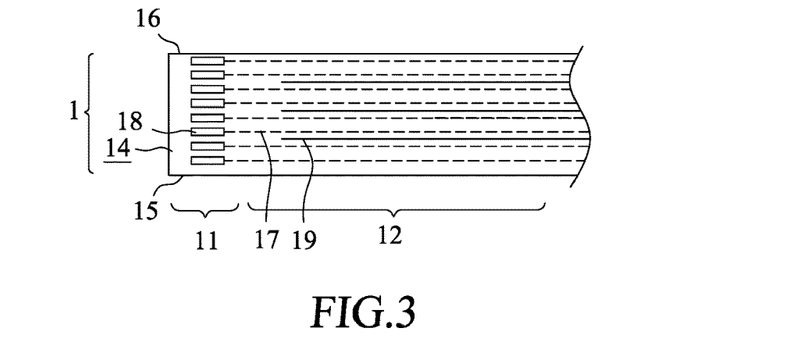
FIG. 3 is a schematic view illustrating the flexible printed circuit board of FIG. 1 in a folded condition.
Figure 4:
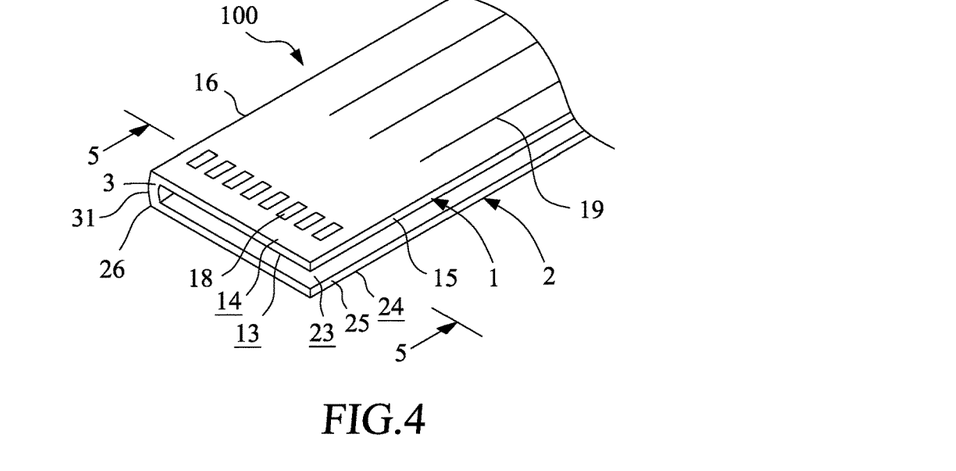
FIG. 4 is a perspective view illustrating the flexible printed circuit board of FIG. 1 in the folded condition.
Figure 5:
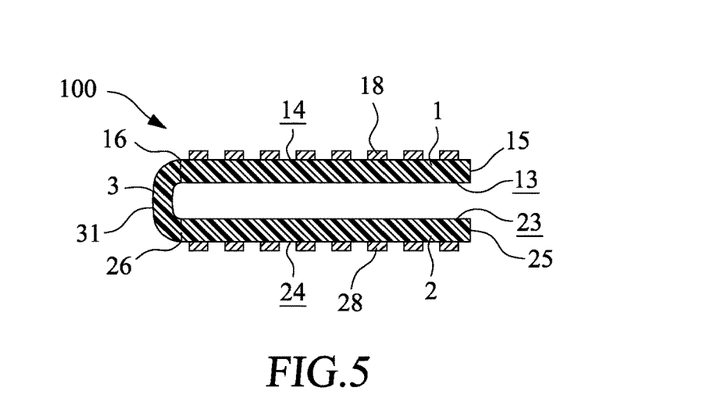
FIG. 5 is a cross-sectional view taken along line 5-5 of FIG. 4.

Referring to FIGS. 3, 4, and 5, these drawings show through connection made with the curved connection section 3, the first bonding surface 13 of the first flexible printed circuit board 1 is folded in a direction toward and stacked on the second bonding surface 23 of the second flexible printed circuit board 2 so that the curved connection section 3 forms a curved continuous surface 31 and the plurality of first contact pads 18 of the first flexible printed circuit board 1 are set to respectively correspond to the plurality of second contact pads 28 of the second flexible printed circuit board 2.

Figure 6:
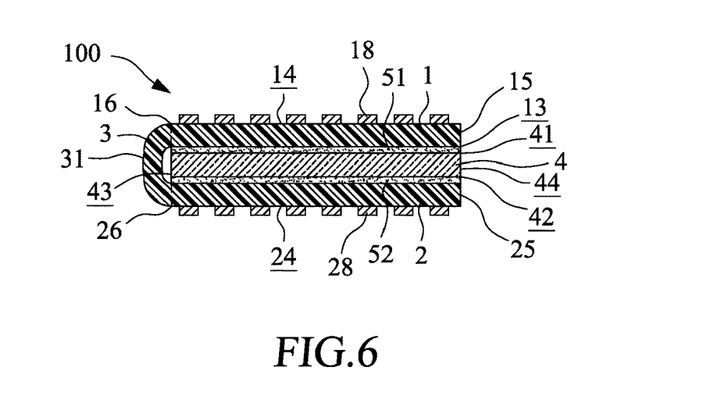
FIG. 6 is a cross-sectional view illustrating the folded flexible printed circuit board of FIG. 5 combined with a height adjustment layer.
Figure 7:
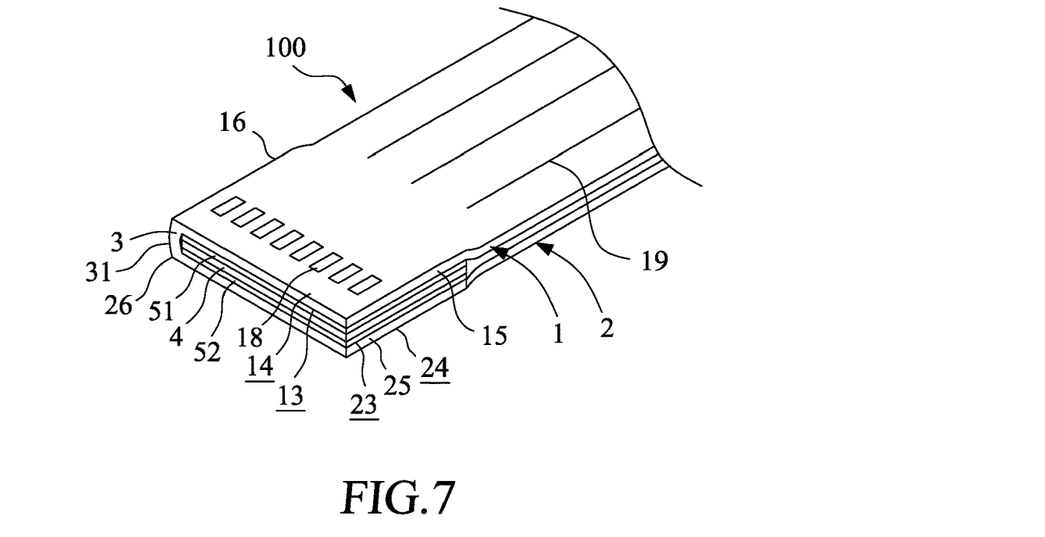
FIG. 7 is a perspective view illustrating the folded flexible printed circuit board of FIG. 4 combined with a height adjustment layer.

Referring to FIGS. 6 and 7, the present invention further comprises a height adjustment layer 4, which comprises a first surface 41 and a second surface 42 and two lateral edges 43, 44 and is combined between the first bonding surface 13 of the first flexible printed circuit board 1 and the second bonding surface 23 of the second flexible printed circuit board 2. The first surface 41 and the second surface 42 of the height adjustment layer 4 can be adhesively bonded, by means of for example adhesive materials 51, 52, to the first bonding surface 13 of the first flexible printed circuit board 1 and the second bonding surface 23 of the second flexible printed circuit board 2, respectively.

The curved connection section 3 is connected, in a manner of being unitarily integrated, to and between the first inner side edge 16 of the first flexible printed circuit board 1 and the second inner side edge 26 of the second flexible printed circuit board 2 so that the curved continuous surface 31 formed between the first inner side edge 16 of the first flexible printed circuit board 1 and the second inner side edge 26 of the second flexible printed circuit board 2 covers one of the lateral edges 43 of the height adjustment layer 4.

Figure 8:
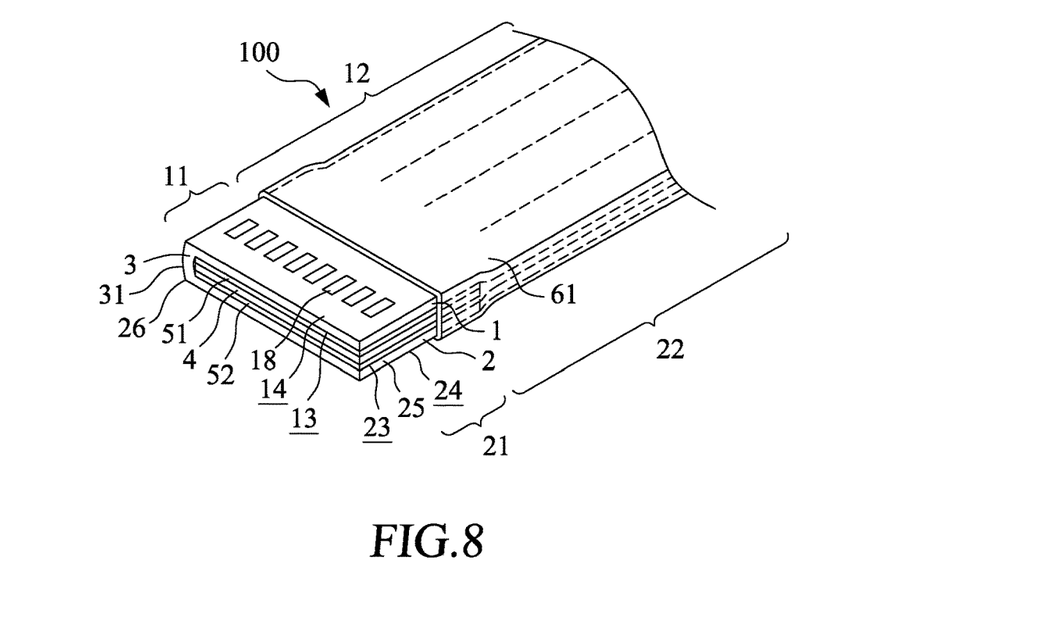
FIG. 8 is a perspective view illustrating a first extension section of a first flexible printed circuit board and a second extension section of a second flexible printed circuit board shown in FIG. 7 in a stacked form that is enclosed by an enclosure protection layer.

Referring to FIG. 8, a perspective view is provided to illustrate the first extension section 12 of the first flexible printed circuit board 1 and the second extension section 22 of the second flexible printed circuit board 2 shown in FIG. 7, after being stacked on each other, is further enclosed by an enclosure protection layer 61 such that only the first plugging section 11 and the second plugging section 21 are exposed outside. The enclosure protection layer 61 can be one of a heat-shrink tube made of heat shrinkable material or a silicone rubber tube made of silicone rubber material.

Figure 9:
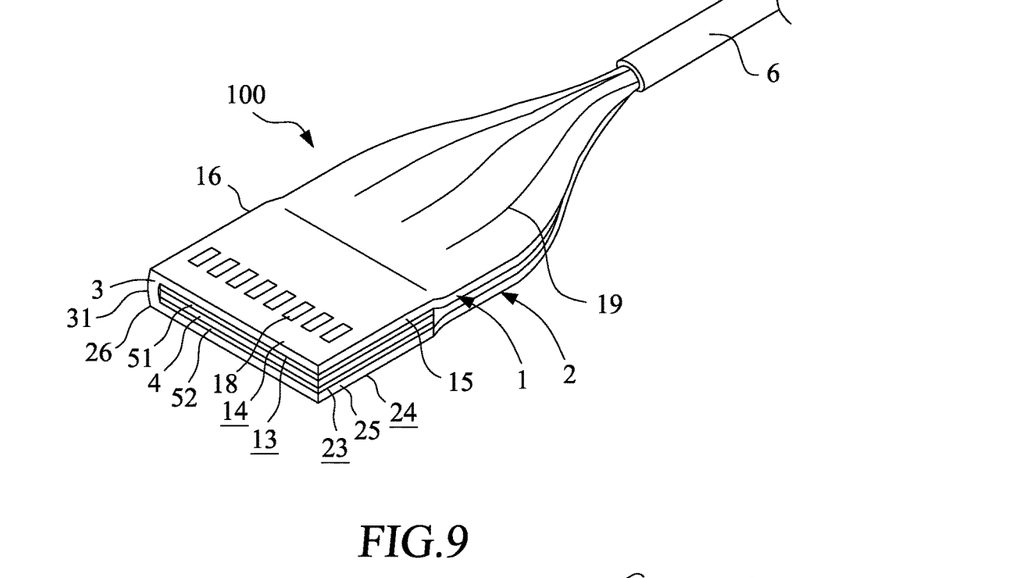
FIG. 9 shows the flexible printed circuit board in a condition of being looped by a looping member.

Referring to FIG. 9, the drawing shows the first extension section 12 of the first flexible printed circuit board 1 and the second extension section 22 of the second flexible printed circuit board 2 are further looped with a looping member 62 to facilitate passage through a narrow hole or a hinge hole.

Figure 10:
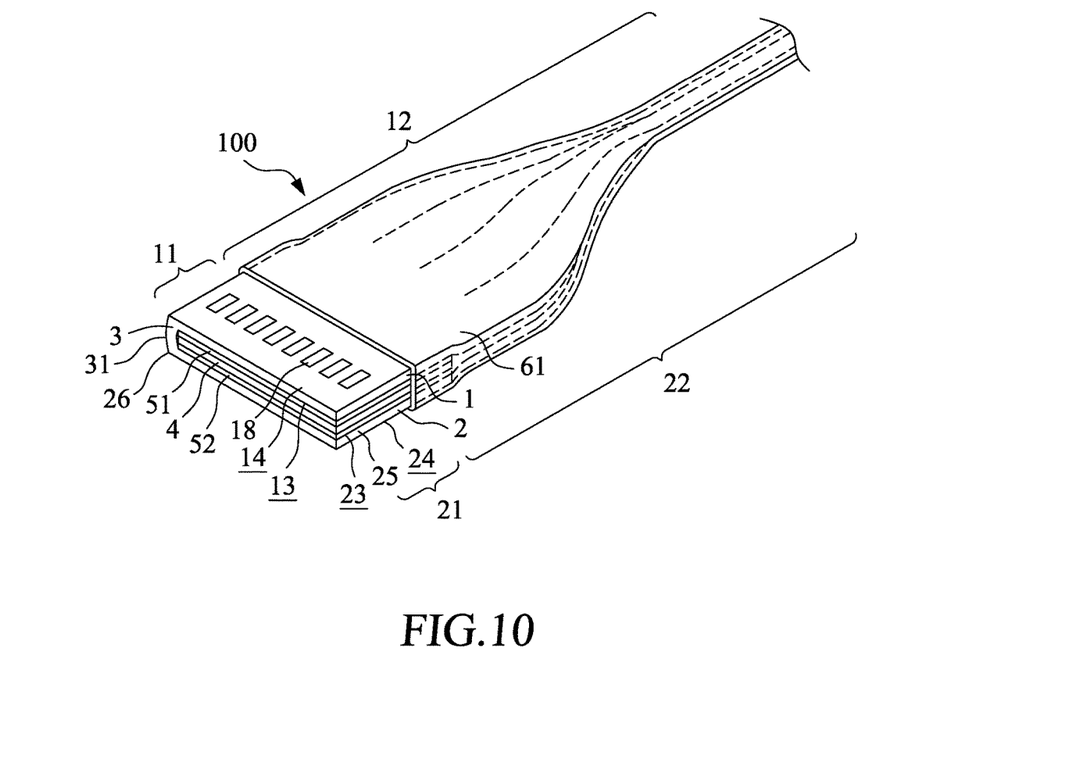
FIG. 10 is a perspective view illustrating a first extension section of a first flexible printed circuit board and a second extension section of a second flexible printed circuit board shown in FIG. 9 in a stacked and looped form that is enclosed by an enclosure protection layer.

Referring to FIG. 10, the drawing shows the first extension section 12 of the first flexible printed circuit board 1 and the second extension section 22 of the second flexible printed circuit board 2 shown in FIG. 9, after being stacked and then looped, are further enclosed with an enclosure protection layer 61 to have only the first plugging section 11 and the second plugging section 21 exposed.

Figure 11:
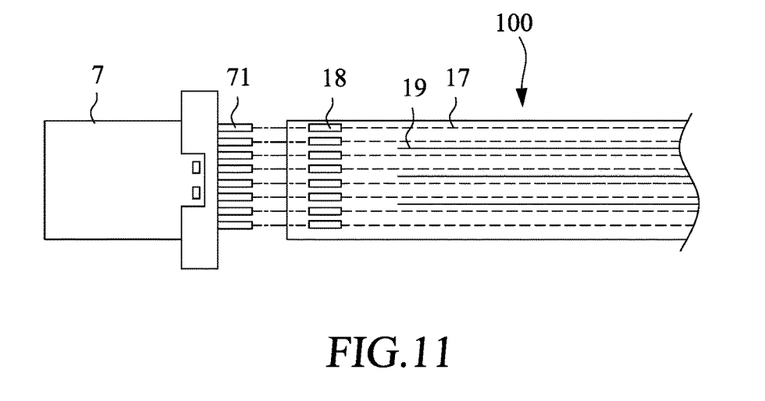
FIG. 11 is a schematic view illustrating contact pads of the flexible printed circuit board in a folded form in a condition of being just to solder to soldering terminals of a plugging member.
Figure 12:
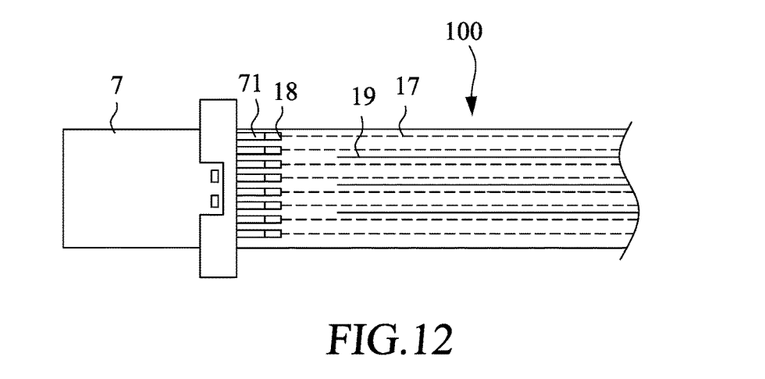
FIG. 12 is a schematic view illustrating contact pads of the flexible printed circuit board in a folded form in a condition of being soldered to soldering terminals of a plugging member.

Referring to FIGS. 11 and 12, these drawings show the first contact pads 18 of the first flexible printed circuit board 1 and the second contact pads 28 (not illustrated in these drawings) of the second flexible printed circuit board 2 are respectively soldered to a plurality of soldering terminals 71 of a plugging member 7. The plugging member 7 can be a commercially available C-Type USB plugging member or other types of plugging member.

Figure 13:
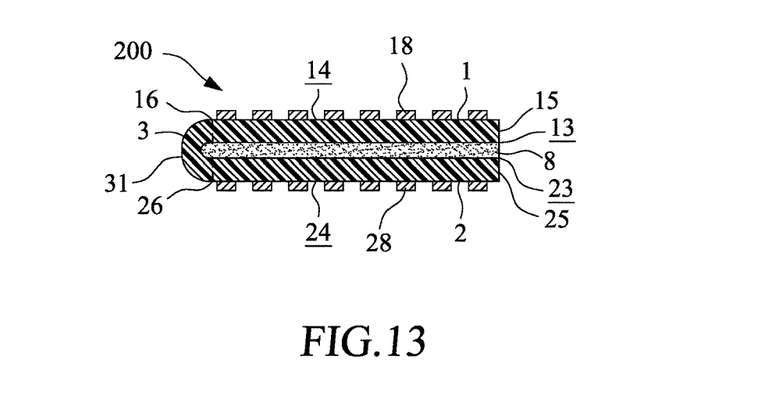
FIG. 13 is a cross-sectional view illustrating a flexible printed circuit board according to a second embodiment of the present invention, in which an adhesive layer takes the place of the height adjustment layer of the first embodiment.
Figure 14:
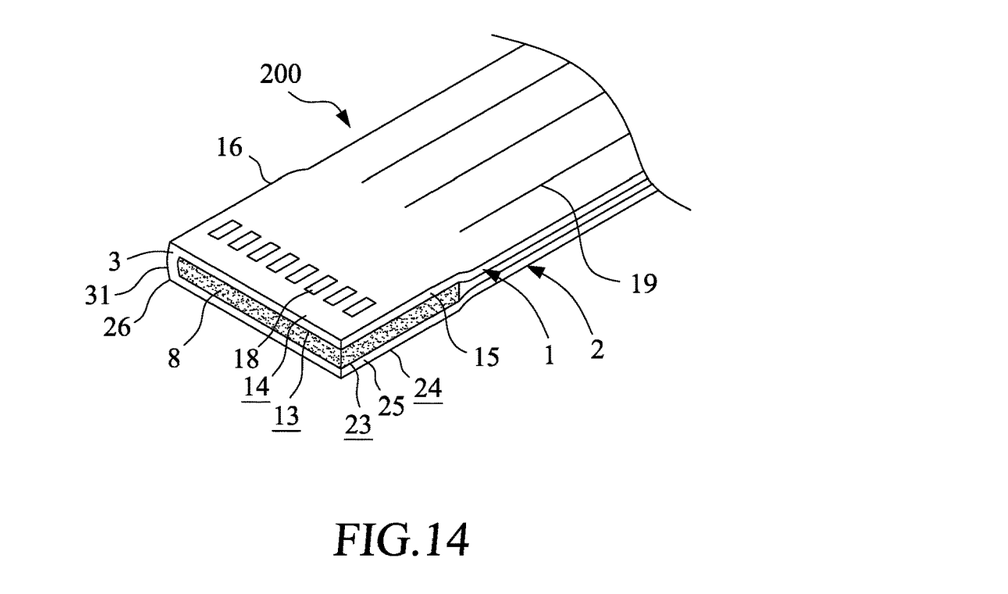
FIG. 14 is a perspective view illustrating the flexible printed circuit board in a folded form combined with an adhesive layer.

FIG. 13 provides a cross-sectional view illustrating a flexible printed circuit board according to a second embodiment of the present invention, in which an adhesive layer is involved to take the place of the height adjustment layer of the first embodiment. FIG. 14 provides a perspective view illustrating the flexible printed circuit board of the second embodiment, generally designated at 200, in a folded form combined with an adhesive layer. The instant embodiment comprises constituent components that are most similar to the counterparts of the first embodiment and similar parts are designated with the same reference for simplicity and consistency. The instant embodiment similarly comprises a first flexible printed circuit board 1, a second flexible printed circuit board 2, and a curved connection section 3 connected to and between side edges of the first flexible printed circuit board 1 and the second flexible printed circuit board 2; however, in the instant embodiment, an adhesive layer 8 is provided to replace the height adjustment layer 4 of the first embodiment. The adhesive layer 8 is adhesively bonded between the first bonding surface 13 of the first flexible printed circuit board 1 and the second bonding surface 23 of the second flexible printed circuit board 2.

Figure 15:
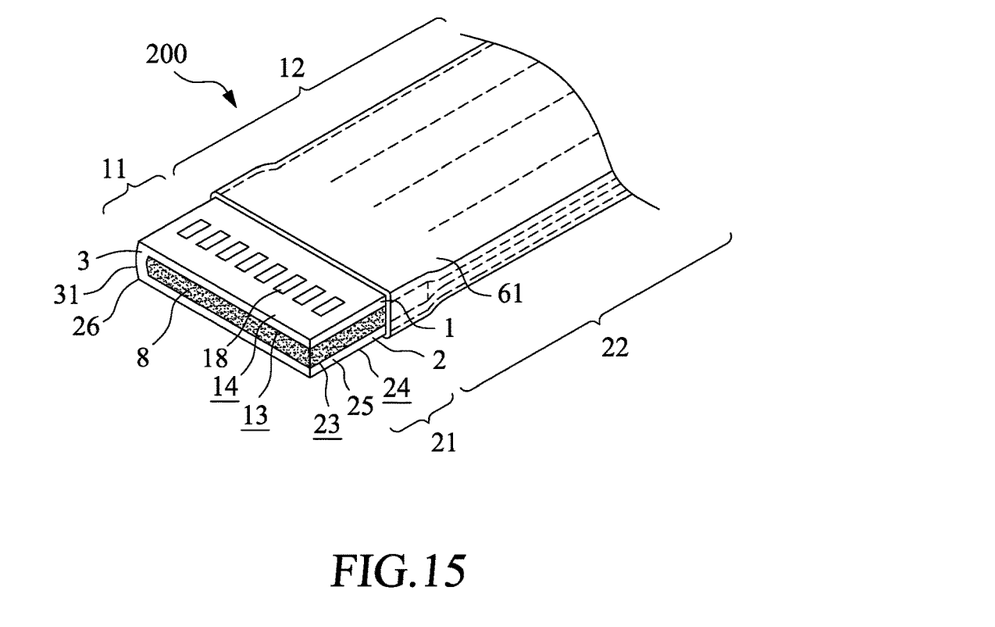
FIG. 15 is a perspective view illustrating a first extension section of a first flexible printed circuit board and a second extension section of a second flexible printed circuit board shown in FIG. 14 in a stacked form that is enclosed by an enclosure protection layer.

Referring to FIG. 15, the drawing illustrates the first extension section 12 of the first flexible printed circuit board 1 and the second extension section 22 of the second flexible printed circuit board 2 shown in FIG. 14, after being stacked, is enclosed with an enclosure protection layer 61 with only the first plugging section 11 and the second plugging section 21 exposed outside.

Figure 16:
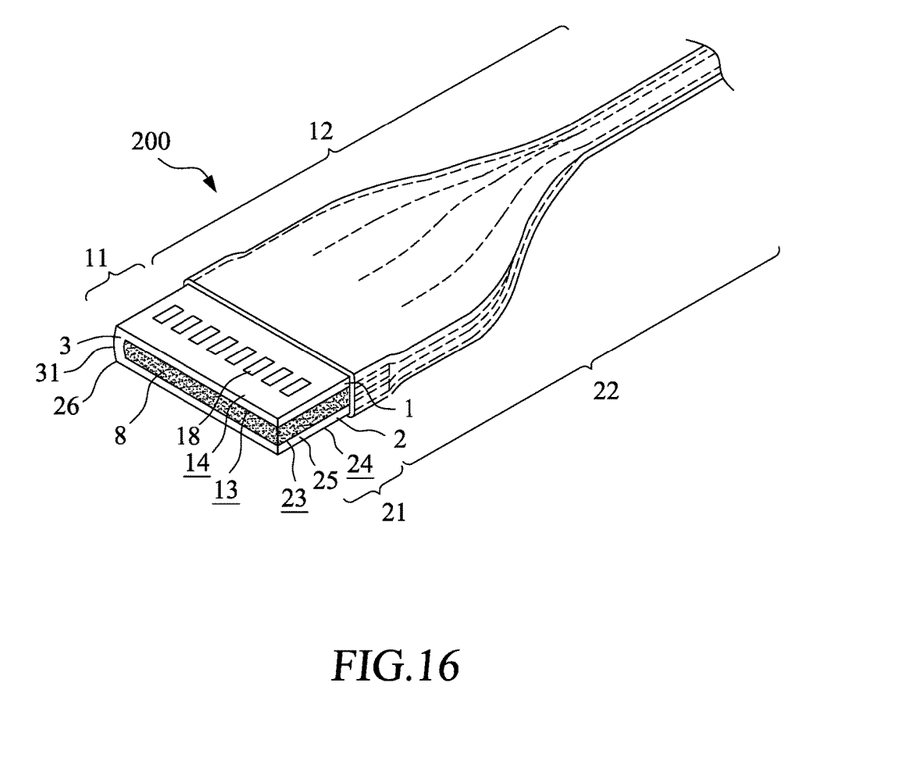
FIG. 16 is a perspective view illustrating a first extension section of a first flexible printed circuit board and a second extension section of a second flexible printed circuit board shown in FIG. 14 in a stacked and looped form that is enclosed by an enclosure protection layer.

Referring to FIG. 16, the drawing illustrates the first extension section 12 of the first flexible printed circuit board 1 and the second extension section 22 of the second flexible printed circuit board 2 of FIG. 14, after being stacked and looped, is enclosed with an enclosure protection layer 61 with only the first plugging section 11 and the second plugging section 21 exposed outside.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A stacked flexible printed circuit board assembly, comprising:
   a first flexible printed circuit board including a first plugging section and a first extension section extending from the first plugging section in an extension direction, the first plugging section including a first bonding surface and a first exposed surface, the first flexible printed circuit board being delimited with a first outer side edge and a first inner side edge;
   a plurality of first circuit traces arranged in the extension direction on the first extension section of the first flexible printed circuit board;
   a plurality of first contact pads arranged in a manner of being spaced from each other on the first plugging section of the first flexible printed circuit board and are located on the first exposed surface and connected to the plurality of first circuit traces;
   a second flexible printed circuit board including a second plugging section and a second extension section extending from the second plugging section in the extension direction, the first extension section of the first flexible printed circuit board and the second extension section of the second flexible printed circuit board being stacked and enclosed with an enclosure protection layer, the second plugging section including a second bonding surface and a second exposed surface, the second plugging section being a plugging terminal section located adjacent to the second flexible printed circuit board, the second flexible printed circuit board being delimited with a second outer side edge and a second inner side edge;
   a plurality of second circuit traces arranged in the extension direction on the second extension section of the second flexible printed circuit board;
   a plurality of second contact pads arranged in a manner of being spaced from each other on the second plugging section of the second flexible printed circuit board and are located on the second exposed surface and connected to the plurality of second circuit traces;
   a curved connection section integrally connected to and between the first inner side edge of the first flexible printed circuit board and the second inner side edge of the second flexible printed circuit board, the first bonding surface of the first flexible printed circuit board being folded in a direction toward and stacked on the second bonding surface of the second flexible printed circuit board so that the curved connection section forms a curved continuous surface and the plurality of first contact pads of the first flexible printed circuit board respectively correspond to the plurality of second contact pads of the second flexible printed circuit board; and
   a height adjustment layer, which is combined between the first bonding surface of the first flexible printed circuit board and the second bonding surface of the second flexible printed circuit board.

2. The stacked flexible printed circuit board assembly as claimed in claim 1, wherein the plurality of first contact pads and the plurality of second contact pads are respectively soldered to a plurality of soldering terminals of a plugging member.

3. The stacked flexible printed circuit board assembly as claimed in claim 1, wherein the first flexible printed circuit board and the second flexible printed circuit board are each one of a thin-film printed electronic flat cable, a flexible flat cable (FFC), and a flexible printed circuit board (FPC).

4. The stacked flexible printed circuit board assembly as claimed in claim 1, wherein:
   the first extension section of the first flexible printed circuit board is subjected to slitting in the extension direction to form a plurality slit lines; and
   the second extension section of the second flexible printed circuit board is subjected to slitting in the extension direction to form a plurality slit lines.

5. The stacked flexible printed circuit board assembly as claimed in claim 1, wherein the enclosure protection layer is selected from one of heat-shrink tube and silicone rubber tube.

6. A stacked flexible printed circuit board, comprising:
   a first flexible printed circuit board including a first plugging section and a first extension section extending from the first plugging section in a extension direction, the first plugging section including a first bonding surface and a first exposed surface, the first flexible printed circuit board being delimited with a first outer side edge and a first inner side edge;
   a plurality of first circuit traces, which is arranged in the extension direction on the first extension section of the first flexible printed circuit board;
   a plurality of first contact pads, which are arranged, in a manner of being spaced from each other, on the first plugging section of the first flexible printed circuit board and are located on the first exposed surface and connected to the plurality of first circuit traces;
   a second flexible printed circuit board including a second plugging section and a second extension section extending from the second plugging section in the extension direction, the first extension section of the first flexible printed circuit board and the second extension section of the second flexible printed circuit board being stacked and enclosed with an enclosure protection layer, the second plugging section including a second bonding surface and a second exposed surface, the second plugging section being a plugging terminal section located adjacent to the second flexible printed circuit board, the second flexible printed circuit board being delimited with a second outer side edge and a second inner side edge;
   a plurality of second circuit traces, which are arranged in the extension direction on the second extension section of the second flexible printed circuit board;
   a plurality of second contact pads, which are arranged, in a manner of being spaced from each other, on the second plugging section of the second flexible printed circuit board and are located on the second exposed surface and connected to the plurality of second circuit traces;
   a curved connection section integrally connected to and between the first inner side edge of the first flexible printed circuit board and the second inner side edge of the second flexible printed circuit board, the first bonding surface of the first flexible printed circuit board being folded in a direction toward and stacked on the second bonding surface of the second flexible printed circuit board so that the curved connection section forms a curved continuous surface and the plurality of first contact pads of the first flexible printed circuit board respectively correspond to the plurality of second contact pads of the second flexible printed circuit board; and an adhesive layer, which is adhesively bonded between the first bonding surface of the first flexible printed circuit board and the second bonding surface of the second flexible printed circuit board.

7. The stacked flexible printed circuit board assembly as claimed in claim 6, wherein the plurality of first contact pads and the plurality of second contact pads are respectively soldered to a plurality of soldering terminals of a plugging member.

8. The stacked flexible printed circuit board assembly as claimed in claim 6, wherein the first flexible printed circuit board and the second flexible printed circuit board are each one of a thin-film printed electronic flat cable, a flexible flat cable (FFC), and a flexible printed circuit board (FPC).

9. The stacked flexible printed circuit board assembly as claimed in claim 6, wherein:

the first extension section of the first flexible printed circuit board is subjected to slitting in the extension direction to form a plurality slit lines; and the second extension section of the second flexible printed circuit board is subjected to slitting in the extension direction to form a plurality slit lines.

10. The stacked flexible printed circuit board assembly as claimed in claim 6, wherein the enclosure protection layer is selected from one of heat-shrink tube and silicone rubber tube.

* * * * *